United States Patent
Shi

(10) Patent No.: US 10,353,228 B2
(45) Date of Patent: Jul. 16, 2019

(54) METHOD FOR MANUFACTURING FLEXIBLE DISPLAY SUBSTRATE

(71) Applicant: SHENZHEN CHINA STAR OPTOELECTRONICS TECHNOLOGY CO., LTD., Guangdong (CN)

(72) Inventor: Wen Shi, Guangdong (CN)

(73) Assignee: SHENZHEN CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 221 days.

(21) Appl. No.: 15/329,254

(22) PCT Filed: Dec. 20, 2016

(86) PCT No.: PCT/CN2016/111054
§ 371 (c)(1),
(2) Date: Jan. 26, 2017

(87) PCT Pub. No.: WO2018/072302
PCT Pub. Date: Apr. 26, 2018

(65) Prior Publication Data
US 2018/0107046 A1    Apr. 19, 2018

(30) Foreign Application Priority Data
Oct. 18, 2016    (CN) .......................... 2016 1 0903898

(51) Int. Cl.
*G02F 1/1333*    (2006.01)
*H05K 1/03*    (2006.01)

(52) U.S. Cl.
CPC ..... *G02F 1/133305* (2013.01); *H05K 1/0393* (2013.01); *G02F 2001/133354* (2013.01)

(58) Field of Classification Search
None
See application file for complete search history.

(56) References Cited

U.S. PATENT DOCUMENTS

2017/0271593 A1    9/2017  Zhou
2017/0373100 A1    12/2017 Zhao

FOREIGN PATENT DOCUMENTS

| CN | 104319263 | * | 1/2015 |
|----|-----------|---|--------|
| CN | 104319263 A | | 1/2015 |
| CN | 104992944 | * | 10/2015 |
| CN | 104992944 A | | 10/2015 |
| CN | 105304832 A | | 2/2016 |

\* cited by examiner

*Primary Examiner* — Nathan T Leong
(74) *Attorney, Agent, or Firm* — Mark M. Friedman

(57) ABSTRACT

The present invention provides a method for manufacturing flexible display substrate, comprising: providing a carrier substrate and depositing a layer of soluble polymer on the carrier substrate; fabricating a flexible substrate on the soluble polymer; fabricating a display component on the other surface of the flexible substrate opposite to the soluble polymer and performing a package process; and, peeling off the flexible substrate from the carrier substrate by dissolving the soluble polymer to obtain the flexible display substrate. The method for manufacturing flexible display substrate of the present invention simplifies the manufacture process and avoids damage to the flexible substrate during the peeling process.

7 Claims, 3 Drawing Sheets

METHOD FOR MANUFACTURING FLEXIBLE DISPLAY SUBSTRATE

FIELD OF THE INVENTION

The present invention relates to the field of displays, and in particular, to a method for manufacturing flexible display substrate, which is possible to simplify the manufacturing process and avoid damages to the flexible display substrate caused by.

BACKGROUND OF THE INVENTION

A flexible display panel is a display panel made of a flexible material which can be bent and deformed arbitrarily. The flexible display panel can adapt to a wider working environment due to its light weight, small size, thinness, portability, high and low temperature resistance, impact resistance, and seismic capacity. In recent years, the flexible display panel has become a hot research due to its advantages of curl and appearance of more artistic design. A plurality of flexible display panels are mixed and designed on a same glass substrate to form a flexible display substrate, and then cut the flexible display substrate to produce a plurality of flexible display panels.

In the prior art, methods for manufacturing the flexible display substrate are mainly divided into two categories: one is roll-to-roll manufacturing process, that is, display components are printed directly on the flexible display substrate. However, this process can only produce products with low accuracy requirements due to the limited printing technology and display ink materials, and the yield and reliability are poor. The other is a method of attaching and removing: a flexible display substrate is firstly attached to a hard substrate to prepare the display components, and then peeled off from the hard substrate to obtain the flexible display substrate. This method does not affect the production accuracy of display components, and production equipment and technology are similar to those of the traditional TFT-LCD, therefore this method is relatively easy to achieve. Please refer to FIG. 1, which is a structural schematic view illustrating a traditional flexible display substrate. A flexible substrate 13 is attached to a glass substrate 11 by using an adhesive 12, then fabricating display components 14 followed by peeling off the flexible substrate from the glass substrate 11. However, it is difficult to achieve a good adhesion between the glass substrate and the flexible substrate in the conventional production process, and the flexible substrate can be easily peeled off and the adhesive is not left.

As a result, it is necessary to improve and develop provide the conventional production process of the flexible substrate.

SUMMARY OF THE INVENTION

The object of the present invention is to provide a method for manufacturing flexible display substrate, which can simplify the manufacture process and avoid damage to the flexible substrate during the peeling process.

To achieve the above-mentioned object, a method for manufacturing flexible display substrate is provided, which comprises the following steps: providing a carrier substrate and depositing a layer of soluble polymer on the carrier substrate; fabricating a flexible substrate on the soluble polymer, wherein the soluble polymer is poly(3,4-ethylenedioxythiophene)-poly (styrenesulfonate) (PEDOT:PSS); depositing a water-and-oxygen barrier layer on the other surface of the flexible substrate opposite the soluble polymer, and fabricating a display component on the other surface of the water-and-oxygen barrier layer opposite the flexible substrate followed by packaging the display component to form an encapsulation layer; and peeling off the flexible substrate from the carrier substrate by dissolving the soluble polymer to obtain the flexible display substrate.

To achieve the above-mentioned object, the present invention also provides a method for manufacturing flexible display substrate, which comprises the following steps: providing a carrier substrate and depositing a layer of soluble polymer on the carrier substrate; fabricating a flexible substrate on the soluble polymer; fabricating a display component on the other surface of the flexible substrate opposite the soluble polymer and packaging the display component to form an encapsulation layer; peeling off the flexible substrate from the carrier substrate by dissolving the soluble polymer to obtain the flexible display substrate.

An advantage of the present invention is to introduce soluble polymer (such as poly(3,4-ethylenedioxythiophene)-poly (styrenesulfonate)) between the flexible display substrate and the carrier substrate, such that the flexible substrate is peeled off from the carrier substrate by dissolving the soluble polymer when production is completed, thereby simplify the manufacture process and avoid damage to the flexible substrate during the peeling process.

DESCRIPTION OF THE INVENTION

The method for manufacturing flexible display substrate provided in the present invention is described in detail with reference to the drawings as well as the embodiments. It is clear that embodiments described therein are only part of the embodiments of the present invention, but not all embodiments. All other embodiments obtained by skilled person in the art based on the embodiments of the present invention without making creative work are within the scope of the protection of the present invention.

Figure 1:
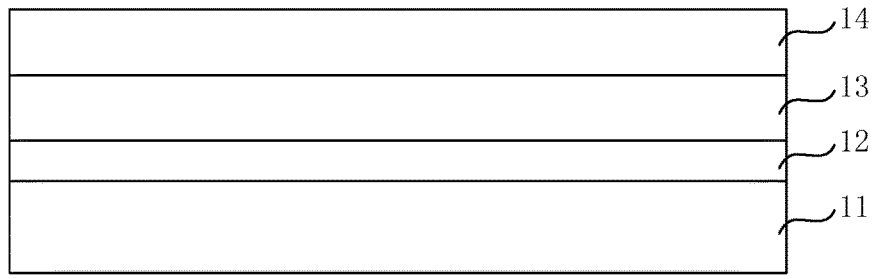
FIG. 1 is a structural schematic view illustrating a traditional flexible display substrate.
Figure 2:
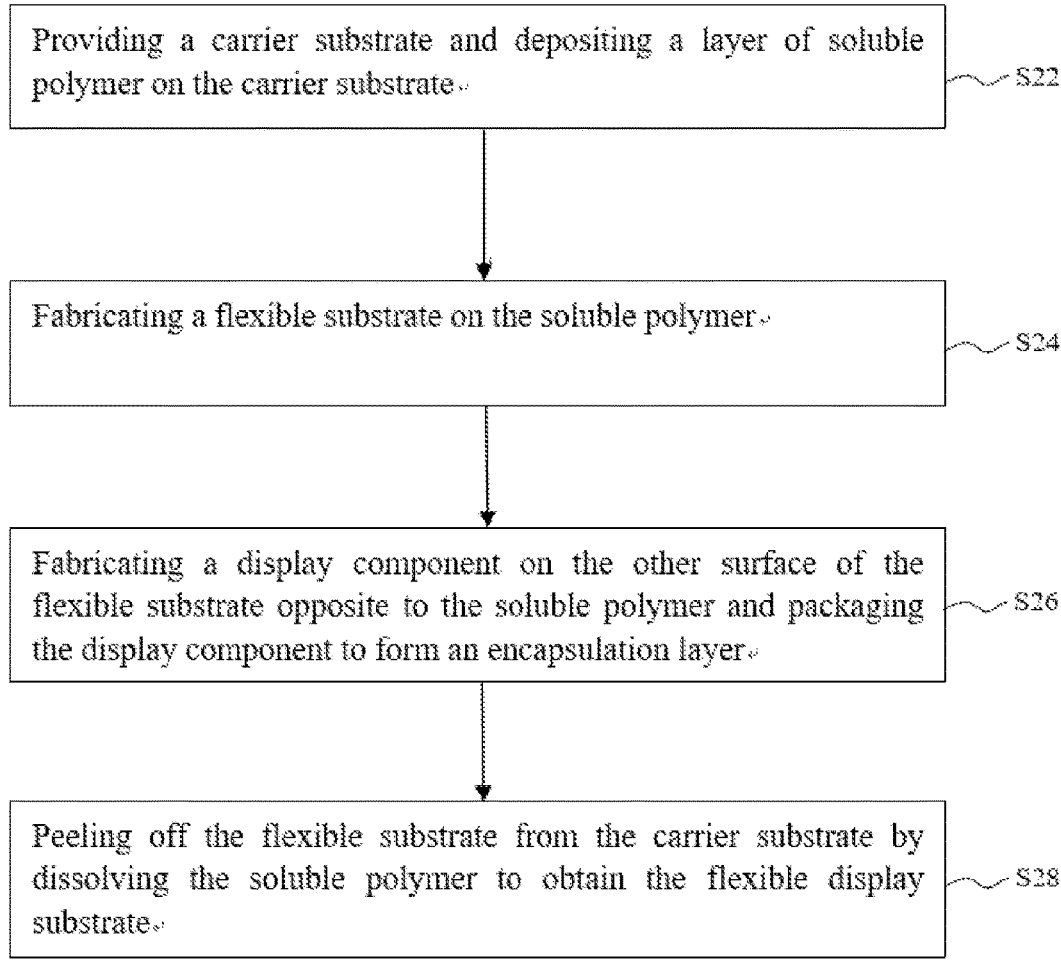
FIG. 2 is a flow chart illustrating a method for manufacturing flexible display substrate according to one embodiment of the present invention.

Referring now to FIG. 2, which is a schematic view illustrating a method for manufacturing flexible display substrate according to one embodiment of the present invention; the method comprises the following steps: S22: providing a carrier substrate and depositing a layer of soluble polymer on the carrier substrate; S24: fabricating a flexible substrate on the soluble polymer; S26: fabricating a display component on the other surface of the flexible substrate opposite to the soluble polymer and packaging the display component to form an encapsulation layer; S28: peeling off the flexible substrate from the carrier substrate by dissolving the soluble polymer to obtain the flexible display substrate. The manufacturing method according to the present invention is described in detail.

Figure 3A:
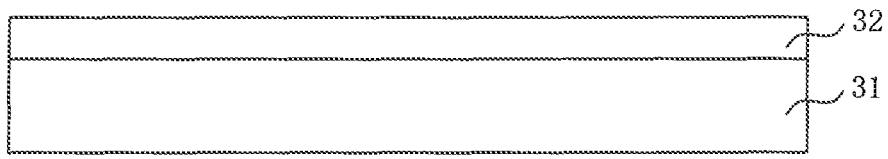
FIG. 3A is a schematic view illustrating depositing a layer of soluble polymer the carrier substrate according to one embodiment of the present invention.

Regarding to the step S22: providing a carrier substrate and depositing a layer of soluble polymer on the carrier substrate, please refer to FIG. 2 and FIG. 3A, wherein the FIG. 3A is a schematic view illustrating depositing a layer of soluble polymer on the carrier substrate according to one embodiment of the present invention. The carrier substrate 31 may be a glass substrate with rigidity. Optionally, the minimum temperature-resistance of the soluble polymer 32 is greater than or equal to 200° C.; the soluble polymer 32 can bear high temperatures and has good solubility after high temperature treatment to ensure a later execution of the peeling process. Optionally, the soluble polymer 32 is water-alcohol soluble polymer, which is selected in consideration of the environmental friendliness of the manufacturing process. Optionally, the water-alcohol soluble polymer may be, but is not limited to, poly(3,4-ethylenedioxythiophene)-poly(styrenesulfonate) (PEDOT:PSS). The PEDOT:PSS is an aqueous solution of a high molecular weight polymer, which has high conductivity and consists of PEDOT and PSS; wherein the PEDOT is a polymer of EDOT(3,4-ethoxylene dioxy thiophene) and the PSS is polystyrene sulfonic acid, and the solubility of PEDOT is greatly increased when get together with the PSS.

Figure 3B:
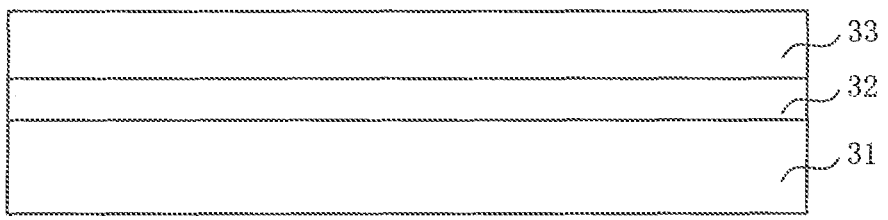
FIG. 3B is a schematic view illustrating fabricating a flexible substrate on the soluble polymer according to one embodiment of the present invention.

Regarding to the step S24: fabricating a flexible substrate on the soluble polymer, please refer to FIG. 2 and FIG. 3B, wherein the FIG. 3B is a schematic view illustrating fabricating a flexible substrate on the soluble polymer according to one embodiment of the present invention, The flexible substrate 33 may be an organic plastics substrate.

Figure 3C:
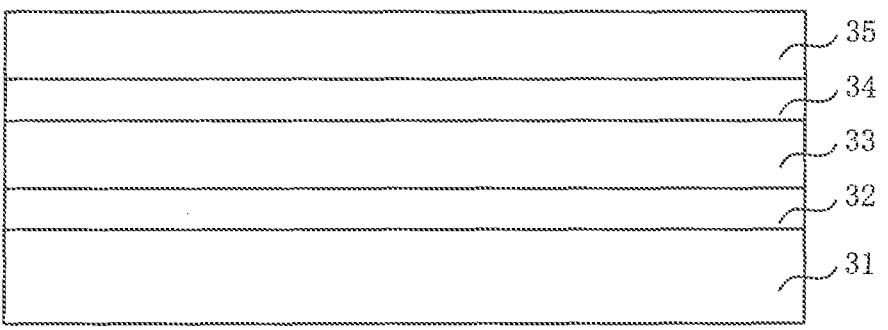
FIG. 3C is a schematic view illustrating forming the water-and-oxygen barrier layer and the light-emitting panel on the flexible substrate in turn according to one embodiment of the present invention.
Figure 3D:
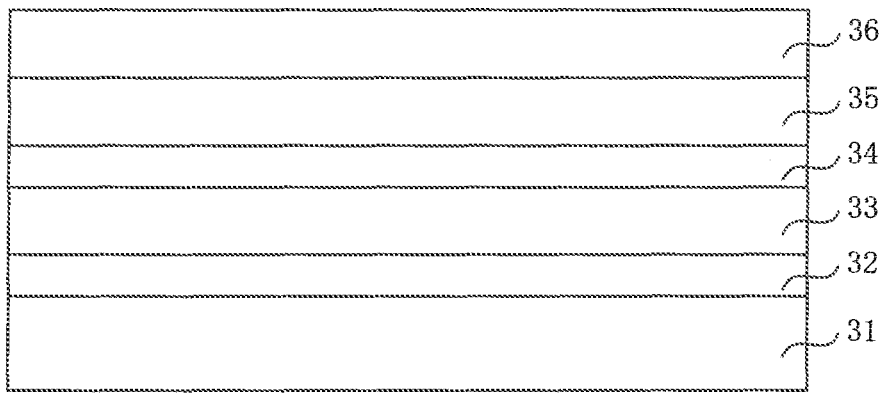
FIG. 3D is a schematic view illustrating the light-emitting panel after packaging the display component to form an encapsulation layer according to one embodiment of the present invention.

Regarding to the step S26: fabricating a display component on the other surface of the flexible substrate opposite to the soluble polymer and performing a package process, please refer to FIG. 2 and FIG. 3C-3D, wherein FIG. 3C is a schematic view illustrating forming the water-and-oxygen barrier layer and the light-emitting panel on the flexible substrate in turn according to one embodiment of the present invention, and FIG. 3D is a schematic view illustrating the light-emitting panel after packaging the display component to form an encapsulation layer according to one embodiment of the present invention. In the present embodiment, a water-and-oxygen barrier layer 34 is deposited between the display component 35 and the flexible substrate 33; Preferably, step S26: fabricating a display component on the other surface of the flexible substrate opposite to the soluble polymer and packaging the display component to form an encapsulation layer further comprises: depositing a water-and-oxygen barrier layer 34 on the other surface of the flexible substrate 33 opposite the soluble polymer 32, and fabricating a display component 35 on the other surface of the water-and-oxygen barrier layer 34 opposite the flexible substrate 33; and optionally, step S26: fabricating a display component on the other surface of the flexible substrate opposite to the soluble polymer and packaging the display component to form an encapsulation layer is : fabricating a light-emitting panel on the other surface of the flexible substrate 33. Further, the light-emitting panel is formed on the water-and-oxygen barrier layer 34, and the entire light-emitting panel is then packaged to form an encapsulation layer 36 illustrated in FIG. 3D.

It should be noted that the display component 35 described in the embodiments of the present invention refers to a structure which is essential for realizing the display and is composed of pattern layers. For example, when the flexible display substrate is an array substrate of an LCD, for a minimum display cell of this array substrate, the display component includes at least a thin film transistor, a pixel electrode, etc.; when the flexible display substrate is a color film substrate of an LCD, for a minimum display cell of this color film substrate, the display component includes a red or green or blue photoresist and a black matrix; when the flexible display substrate is an array substrate of an OLED, for a minimum display cell of this array substrate, the display component includes at least a cathode, an anode and a light-emitting layer. In addition, it is possible to include some necessary pattern layers, such as a protection layer or the like, or some pattern layers for improving the display effect or some defects.

Figure 3E:
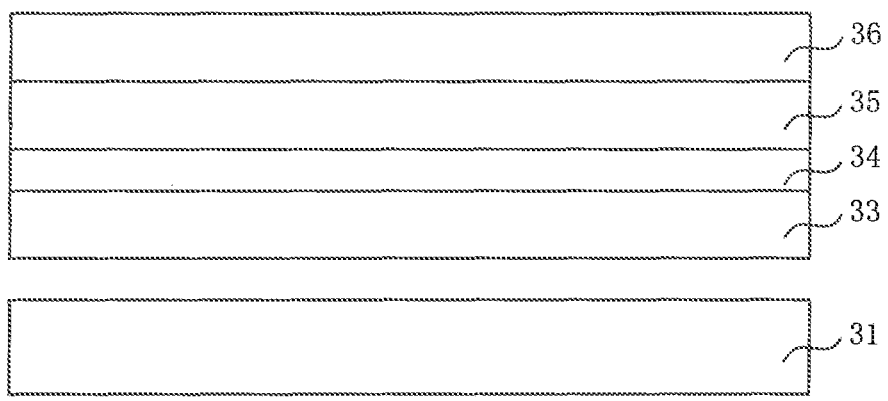
FIG. 3E is a schematic view illustrating peeling off the flexible substrate from the carrier substrate by dissolving the soluble polymer according to one embodiment of the present invention.

Regarding to the step S28: peeling off the flexible substrate from the carrier substrate by dissolving the soluble polymer to obtain the flexible display substrate, please refer to FIG. 2 and FIG. 3E, wherein FIG. 3E is a schematic view illustrating peeling off the flexible substrate from the carrier substrate by dissolving the soluble polymer according to one embodiment of the present invention. For example, when the soluble polymer 32 is a water-soluble polymer, the packaged substrate may be placed in a water-soluble liquid, and separation between the flexible display substrate and the carrier substrate may be achieved by dissolving the water-soluble polymer.

In method for manufacturing flexible display substrate provided in the present invention, a layer of soluble polymer is deposited on a carrier substrate, then a flexible substrate is fabricated followed by fabricating a display component on the flexible substrate and packaging the substrate, and finally, the packaged substrate is placed in a liquid for dissolving the soluble polymer, the flexible display substrate is peeled off from the carrier substrate by the dissolution of the soluble polymer between the carrier substrate and the flexible display substrate. Soluble polymer (such as water-alcohol soluble polymer) is introduced between the flexible display substrate and the carrier substrate in the present invention, such that the flexible substrate is peeled off from the carrier substrate by dissolving the soluble polymer when production is completed, thereby simplify the manufacture process and avoid damage to the flexible substrate during the peeling process.

The above description is only a preferred embodiment of the present invention, it should be noted that skilled person in the art will be able to make several changes and modifications without departing from the principles of the invention, and these changes and modifications are also to be considered within the scope of the present invention.

What is claimed is:

1. A method for manufacturing flexible display substrate, comprising:
   providing a carrier substrate and depositing a layer of soluble polymer on the carrier substrate;
   fabricating a flexible substrate on the soluble polymer, wherein the soluble polymer is poly(3,4-ethylenedioxythiophene)-poly (styrenesulfonate);
   depositing a water-and-oxygen barrier layer on the other surface of the flexible substrate opposite the soluble polymer, and fabricating a display component on the other surface of the water-and-oxygen barrier layer opposite the flexible substrate followed by packaging the display component to form an encapsulation layer; and peeling off the flexible substrate from the carrier substrate by dissolving the soluble polymer to obtain the flexible display substrate.

2. The method according to claim 1, wherein the carrier substrate is a glass substrate.

3. The method according to claim 1, wherein the display component is a light-emitting panel.

4. A method for manufacturing flexible display substrate, comprising:

providing a carrier substrate and depositing a layer of soluble polymer on the carrier substrate;

fabricating a flexible substrate on the soluble polymer, wherein the soluble polymer is poly(3,4-ethylenedioxythiophene)-poly (styrenesulfonate);

fabricating a display component on the other surface of the flexible substrate opposite to the soluble polymer and packaging the display component to form an encapsulation layer;

peeling off the flexible substrate from the carrier substrate by dissolving the soluble polymer to obtain the flexible display substrate.

5. The method according to claim 4, wherein the carrier substrate is a glass substrate.

6. The method according to claim 4, wherein fabricating a display component on the other surface of the flexible substrate opposite to the soluble polymer comprises:

depositing a water-and-oxygen barrier layer on the other surface of the flexible substrate opposite the soluble polymer, and fabricating a display component on the other surface of the water-and-oxygen barrier layer opposite the flexible substrate.

7. The method according to claim 4, wherein the display component a light-emitting panel.

* * * * *